United States Patent
Murphy

(10) Patent No.: US 10,673,417 B2
(45) Date of Patent: Jun. 2, 2020

(54) SPECTRALLY EFFICIENT DIGITAL LOGIC

(71) Applicant: Massachusetts Institute of Technology, Cambridge, MA (US)

(72) Inventor: Robert J. Murphy, Westwood, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/020,283

(22) Filed: Jun. 27, 2018

(65) Prior Publication Data

US 2020/0007113 A1 Jan. 2, 2020

(51) Int. Cl.
*H03K 3/013* (2006.01)
*H03K 19/20* (2006.01)
(Continued)

(52) U.S. Cl.
CPC .......... *H03K 3/013* (2013.01); *H03K 3/0372* (2013.01); *H03K 19/20* (2013.01); *H03K 19/21* (2013.01)

(58) Field of Classification Search
CPC .... H03K 3/013; H03K 3/0372; H03K 3/0375; H03K 3/0377; H03K 19/20; H03K 19/21
See application file for complete search history.

(56) References Cited

U.S. PATENT DOCUMENTS

2004/0218902 A1* 11/2004 Yanagita ............. G11B 27/032 386/248
2006/0098173 A1 5/2006 Naka et al.
(Continued)

FOREIGN PATENT DOCUMENTS

JP 08242173 9/1996
JP H 08-242173 9/1996
(Continued)

OTHER PUBLICATIONS

Jia et al. "Modulation and demodulation method for large aperture laser scintillometer, involves forming multi-resonant oscillating circuit by digital logic apparatus, and controlling laser to emit high frequency carrier wave signal", Digital Logic Not Square Waveforms World Patents, Sep. 5, 2017, 3 pages.
(Continued)

*Primary Examiner* — Patrick C Chen
(74) *Attorney, Agent, or Firm* — Daly, Crowley, Mofford & Durkee, LLP

(57) ABSTRACT

Spectrally-efficient digital logic (SEDL) techniques implement spectrally-efficient pulses (e.g., Gaussian-shaped pulses) in lieu of conventional square waveforms to improve electromagnetic, radio frequency, and other unwanted emissions. The SEDL techniques can be used for combinatorial or sequential logic elements and circuits. A SEDL circuit includes a multiplier circuit configured to receive a clock signal and provide a product of the input signal and a clock signal, an integrator circuit to integrate the product signal over a first portion of a clock period to determine the logic state of the input signal, a limit circuit configured to apply limits to a state result provided to the integrator circuit, and a pulse generator configured to receive the logic state from the limit circuit and provide and output signal having a Gaussian-shaped output pulse that represents that logic value corresponding to the logic value of the input signal.

18 Claims, 10 Drawing Sheets

(51) Int. Cl.
*H03K 3/037* (2006.01)
*H03K 19/21* (2006.01)

(56) References Cited

U.S. PATENT DOCUMENTS

| | | | |
|---|---|---|---|
| 2006/0098713 A1 | 5/2006 | Tian | |
| 2007/0177689 A1 | 8/2007 | Beadle et al. | |
| 2009/0267821 A1 | 10/2009 | Chmelar et al. | |
| 2011/0018626 A1* | 1/2011 | Kojima | H03D 7/1458 |
| | | | 329/306 |
| 2015/0162934 A1 | 6/2015 | Kim et al. | |
| 2017/0237598 A1 | 8/2017 | Bench et al. | |
| 2018/0052558 A1* | 2/2018 | Wang | G06F 3/0416 |

FOREIGN PATENT DOCUMENTS

| | | |
|---|---|---|
| WO | WO 2006/071197 | 7/2006 |
| WO | WO 2006/071197 A1 | 7/2006 |

OTHER PUBLICATIONS

Naiff "I2L Static Shift Register", Digital Logic Not Square Waveform US Patents, Sep. 5, 2017, 2 pages.
Qureshi "Fiber ring lasers and all-optical signal processing devices for wavelength-division multiplexing systems", Digital Logic Not Square Waveform Open Literature, Sep. 5, 2017, 11 pages.
"Transmitter for transmitting a combined clock signal and a digital data signal modulated on a carrier wave", Digital Logic Sine Waveform US Patents, Sep. 5, 2017, 27 pages.
Zhao et al. "Design of Picosecond Short Pulse Based on Dual NOT Gates Structure", Sine Waveform Open Literature, Sep. 5, 2017, 26 pages.
Partial Search Report dated Feb. 27, 2019 for International Application No. PCT/US2018/039704; 12 Pages.
Qureshi "Fiber ring lasers and all-optical signal processing devices for wavelength-division multiplexing systems", Digital Logic Not Square Waveform Open Literature, In Dissertation Abstracts International. vol. 68, No. 02, suppl. B, Sep. 5, 2017, 11 pages.
PCT Search Report and Written Opinion dated Apr. 23, 2019 for PCT Application No. PCT/US2018/039704; 18 pages.
Search Report dated Apr. 23, 2019 for International Application No. PCT/US2018/039704; 18 Pages.
PCT International Search Report and Written Opinion dated Jan. 10, 2020 for International Application No. PCT/US2019/039490; 19 Pages.
Invitation to Pay Additional Fees and Partial PCT Search Report dated Oct. 30, 2019 for International Application No. PCT/US2019/039490; 14 Pages.
Wentzloff et al., "System Design Considerations for Ultra-Wideband Communication" IEEE Communications Magazine (vol. 43, Issue: 8) Aug. 22, 2005; 8 Pages.
U.S. Non-Final Office Action dated Apr. 8, 2020 for U.S. Appl. No. 16/451,624; 29 Pages.

* cited by examiner

SPECTRALLY EFFICIENT DIGITAL LOGIC

GOVERNMENT RIGHTS

This invention was made with Government support under Contract No. FA8702-15-D-0001 awarded by the U.S. Air Force. The Government has certain rights in the invention.

FIELD

The concepts, systems, configurations, devices and techniques described herein relate generally to combinatorial and sequential circuits that implement digital logic.

BACKGROUND

Consumer products are required to adhere to EMI/RFI (electromagnetic interference/radio frequency interference) regulations to reduce emissions and interferences from electromagnetic and RF (radio frequency) sources. EMI/RFI may be any disturbance generated by an external source that affects an electrical circuit by electromagnetic induction, electrostatic coupling, or conduction. There is a very large industry involving EMI/RFI regulations compliance testing and/or mitigation. There is also some concern among consumers about potential health hazards associated with electromagnetic and radio frequency emissions from electronic products. Electronic products and systems are typically required to pass EMI/RFI testing to ensure that they do not pollute any components, devices, or persons in their vicinity. For example, EMI/RFI must be mitigated for cellular technology manufacturers, data service providers, computer manufacturers, aerospace systems, automotive industry, military electronics, appliance manufacturers, medical devices, and toy/video game manufacturers, among many others.

Digital circuits (e.g. a digital processor or other logic element) generally operate on signal waveforms having a square shape (e.g. a sequence of pulses having rising and falling edges which are generally square or rectangular in shape). When such square waveforms are generated, transmitted, received or otherwise used by a digital processor or other logic element, the square edges may produce spurious signals over a wide range of frequencies. Such broadband spectral content can make its way back to other components, such as sensors, actuators, and analog signal conditioners. This extraneous and unwanted spectral content often limits or degrades sensor/actuator performance. Extraneous content can make its way to sensitive electronics generally in at least two ways. First, via conducted paths, such as power supplies, grounds, etc., and second, via radiated paths, such as crosstalk, EMI, etc. Safeguarding against these sources of ingress can often be very challenging.

Systems containing sensors (of any type) are particularly susceptible to EMI/RFI emissions, for example from conductive paths or radiative paths. Even systems not containing sensors are usually required to pass EMI/RFI testing to ensure that such systems do not pollute other systems or subsystems through electromagnetic or radio frequency emissions. Electrical interference from one sub-system (often digital) can degrade the performance of another (often a sensor or an analog component).

It would, therefore, be desirable to provide a digital logic family with intrinsically low EMI/RFI emissions.

SUMMARY

In a circuit, a method to assess a state of an incoming bit comprises receiving an input signal; receiving a clock signal; obtaining a product signal from the product of the input and clock signals; integrating the product signal over a clock period to determine a logic state of the input signal; providing the determined logic state to a pulse generator; and providing an output signal having a spectrally-efficient-shape at an output of the pulse generator, wherein the spectrally-efficient-shaped output signal represents a logic value corresponding to the logic value of the input signal. The product signal can be integrated over a first-half of the clock period and the output signal is output by the pulse generator over a second-half of the clock period. The product signal can be integrated over a first portion of the clock period and the output signal is output by the pulse generator over a second portion of the clock period. The spectrally-efficient-shaped pulses can be Gaussian-shaped pulses. Integrating the product signal over one-half of a clock period can comprise obtaining an average value; slowly discharging the average over the second half of the clock period; and determining the logic state (State(k)) of the input signal according to:

$$\text{State}(k) = \int_{t_k}^{t_k+T/2} \text{Input}(t_k) * \text{Clk}(t_k) dt$$

in which:
State(k) is the logic state of the input signal;
Input(t) is the input signal at time;
Clk(t) is the clock signal at time.

The method of claim 1 can provide the determined logic state to a pulse generator by applying limits to state result; formulating the pulses from the incoming clock; and State steers a 0 to Q and a 1 to Qbar or vise-versa. The spectrally efficient waveform can be formed by EXP$-0.5*(t/\sigma)^2$ Fourier Transform $\rightarrow \sigma * \text{sqrt}(2*\pi)*\text{EXP}-0.5*(\omega*\sigma)^2$. The circuit can comprise a combinatorial circuit. The circuit can comprise a sequential circuit.

A circuit comprises a multiplier circuit having a first input configured to receive an input signal and having a second input configured to receive a clock signal and having an output configured to provide a product signal corresponding to the product of an input signal and a clock signal; an integrator circuit having an input coupled to the output of said multiplier circuit and having an output, said integrator configured to integrate the product signal over a clock period to determine a logic state of the input signal; a limit circuit having an input coupled to the output of said integrator circuit and having an output, said limit circuit configured to apply limits to a state result provided to the input thereof from said integrator circuit; and a pulse generator having an input coupled to the output of said limit circuit and having an output, said pulse generator configured to receive the logic state from said limit circuit and to provide over the clock period at the output thereof an output signal having a Gaussian-shape output signal pulse, wherein the Gaussian-shaped output signal pulse represents a logic value corresponding to the logic value of the input signal. The product signal can be integrated over a first-half of the clock period and the output signal is output by the pulse generator over a second-half of the clock period. The product signal can be integrated over a first portion of the clock period and the output signal is output by the pulse generator over a second portion of the clock period. The spectrally-efficient-shaped pulses can be Gaussian-shaped pulses. The integrator is configured to determine during a first-half of a clock period, a logic state of the input signal according to:

$$\text{State}(k) = \int_{t_k}^{t_k+T/2} \text{Input}(t_k) * \text{Clk}(t_k) dt$$

in which:
State(k) is the logic state of the input signal;

Input(t) is the input signal at time;
Clk(t) is the clock signal at time.

The spectrally efficient waveform can be formed by EXP−0.5*(t/σ)^2 Fourier Transform→σ*sqrt(2*π)*EXP−0.5*(ω*σ)^2.

In a circuit, a method comprising receiving a spectrally-efficient signal comprising a plurality of spectrally-efficient pulses; receiving a complementary spectrally-efficient signal; comparing the spectrally-efficient signal to the complementary spectrally-efficient signal; and determining a logical value corresponding to the spectrally-efficient signal. The spectrally-efficient signal comprises a plurality of Gaussian shaped pulses. The circuit comprises at least one of a combinatorial circuit and a sequential circuit.

BRIEF DESCRIPTION OF THE DRAWINGS

The foregoing features may be more fully understood from the following description of the drawings in which.

Figure 1:
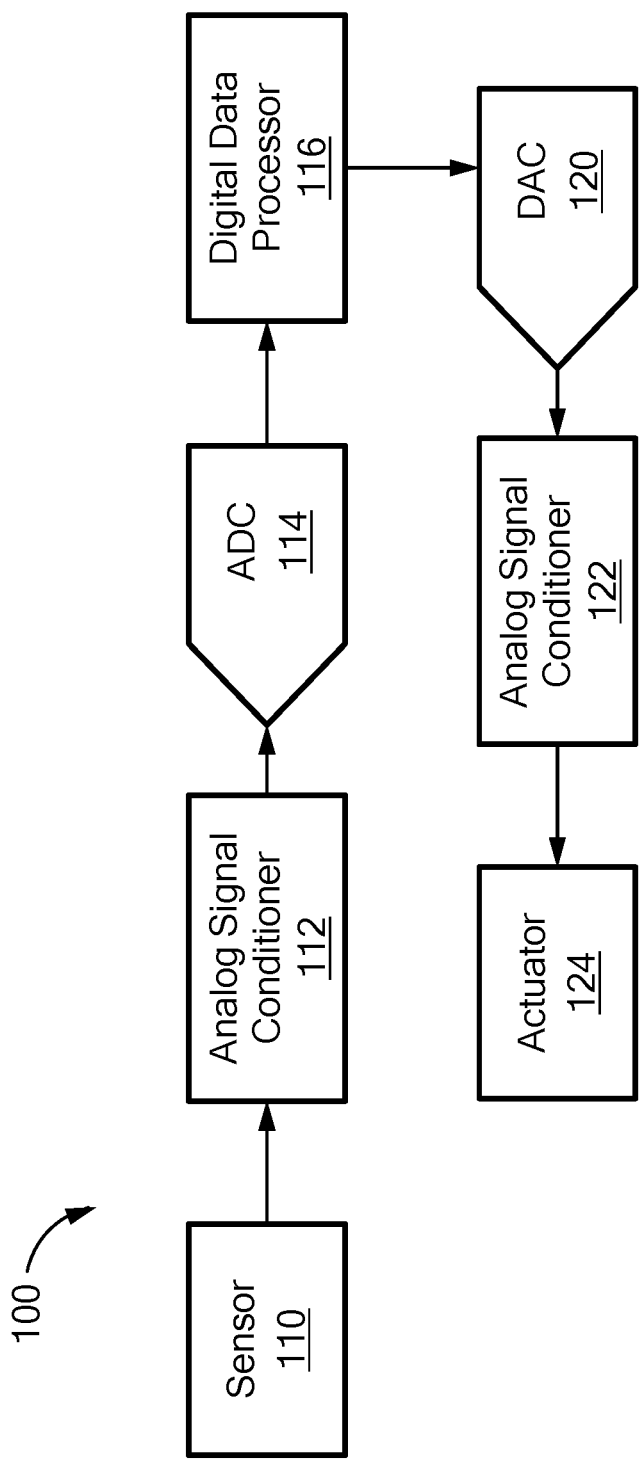
FIG. 1 is a block diagram of an illustrative system containing one or more sensors and operable with spectrally efficient digital logic (SEDL)

It should be appreciated that the drawings are not necessarily to scale, or inclusive of all elements of a system, emphasis instead generally being placed upon illustrating the concepts, structures, and techniques sought to be protected herein.

DETAILED DESCRIPTION

Before proceeding with a discussion of illustrative embodiments of spectrally efficient digital logic (SEDL) techniques (referred to herein as "SEDL" or "spectrally-efficient" techniques), some introductory concepts and terminology are explained.

In general overview, the term "digital logic circuit" (or more simply "logic circuit" or "logic element") refers to a circuit or device capable of receiving one or more input signals (or more simply "inputs") and in response thereto, providing one or more output signals (or more simply "outputs") with the output signal having a Boolean logic relationship to the input signal. One type of logic circuit is a logic gate (such as an AND gate). Digital logic circuits may have one or more inputs, and one or more outputs. Individual logic circuits can be connected together to form combinatorial or sequential circuits, or relatively complicated logical functions that can include both combinatorial (e.g., gate) and sequential (e.g., flip-flop) components. Known digital logic families include, but are not limited to, transistor-transistor logic (TTL), complementary-metal-oxide semiconductor (CMOS) logic, and emitter-coupled logic (ECL), for example.

The spectrally efficient techniques disclosed herein are applicable to both CMOS and bipolar technologies, as well as optical transceivers, and more generally any system that receives signals and performs digital logic or processing.

In accordance with an embodiment of concepts, systems, methods and devices described herein, rather than providing or otherwise utilizing conventional square waves to represent an incoming bit (or to output a logical 1 or 0 from a spectrally efficient waveform), in accordance with the techniques described herein, spectrally efficient waveforms (e.g., waveforms which include pulses having a Gaussian or other spectrally efficient shape) may be provided to a digital circuit such as a digital processor. The spectrally efficient waveforms reduce spectral content and, thus, reduce EMI/RFI produced by the associated circuit(s).

One advantage of using spectrally efficient pulses as compared to a conventional square wave, for example, is that spectrally efficient pulses do not make use of fast-edge switching. Waveforms which include square edges needed for fast edge switching produce a relatively large number of "harmonic signals" (or more simply "harmonics"). Such undesired harmonic signals can be a source of undesired bit errors (sometimes referred to as "logic glitches" or more simply "glitches") in digital circuits. Thus, conventional logic systems which operate with square shaped waveforms are susceptible to logic glitches.

A spectrally efficient waveform is a waveform which produces relatively few "harmonic signals" (or more simply "harmonics"). Thus, the spectrally efficient logic concepts, techniques, systems and devices described herein are tolerant of noise, distortion, and logic glitches as compared to conventional logic systems and techniques.

The SEDL architecture of the present disclosure is more resilient than conventional logic. Furthermore, the spectrally efficient signals also contain a strong clock component, rendering clock recovery easy. Further still, the spectrally efficient techniques also potentially allow the digital portion of an integrated circuit (IC) to be developed using a similar process that is used for the analog/RF portion of the IC, which can simplify development and manufacturing of the IC.

As will be described herein, the spectrally efficient waveforms in accordance with the concepts described herein can be implemented in both combinatorial logic circuits and sequential logic circuits as well as in circuits which include both combinatorial logic and sequential logic in a same circuit.

Using spectrally efficient pulses in combinatorial and/or sequential logic circuits reduces emissions while achieving the same functionality as conventional square waveforms.

Additional advantages of the spectrally efficient pulses described herein include reduced supply/ground "bounce" at the signal transitions (bounce in the signal is greatly reduced at signal state transitions), reduced distortion present on imperfect interconnect transmission line, and reduced EMI/EMC (electromagnetic interference/electromagnetic compatibility) crosstalk, which scales with frequency due to the reduced high frequency content at the same data rate. The emissions are reduced in at least conducted and radiated emissions. Enhanced determination of logic state is achieved through the spectrally efficient pulses, which are noise and distortion tolerant and compatible with standard logic families. The spectrally efficient pulses and concepts described herein can be applied to build an entire logic system or certain desired portions of an overall system. Thus, after reading the disclosure provided herein, it will be appreciated that the SEDL waveforms can be used for either the combinatorial or the sequential circuits, or in circuits including both combinatorial and sequential components, to achieve low EMI/RFI in accordance with the present disclosure.

It should thus be appreciated that the broad concepts described herein are not limited to any particular implementation details such as a specific arrangement of circuits. Rather the broad concepts described herein may be applied to a wide variety of different arrangement of combinatorial and/or sequential circuits while maintaining structural relationships to provide a spectrally efficient system.

As used herein, "and/or" means "and" or "or", as well as "and" and "or." Also, "at least one of X and Y" means "X or Y" as well as "X and Y." Moreover, all patent and non-patent literature cited herein is hereby incorporated by references in its entirety for all purposes.

Turning now to FIG. 1, a system 100, which may be any appropriate instrumentation or device, such as a cell phone or other system having one or more sensor(s) and in some cases actuators as well, includes at least one sensor 110 coupled to an analog signal conditioner 112. The analog signal conditioner 112 conditions (e.g. filters, amplifies, or otherwise processes) the signal received from the sensor 110 and provides the conditioned signal to an analog-to-digital converter (ADC) 114. The ADC receives the signal provided there to and converts the analog signals from signal conditioner 112 into a stream of digital bits. The stream of digital bits produced by ADC 114 are provided to an input of a digital data processor 116 for subsequent processing. In some cases, the resulting process is used to drive actuators via a path including a digital-to-analog converter (DAC) 120, an analog signal conditioner 122, and an actuator 124.

Figure 3:
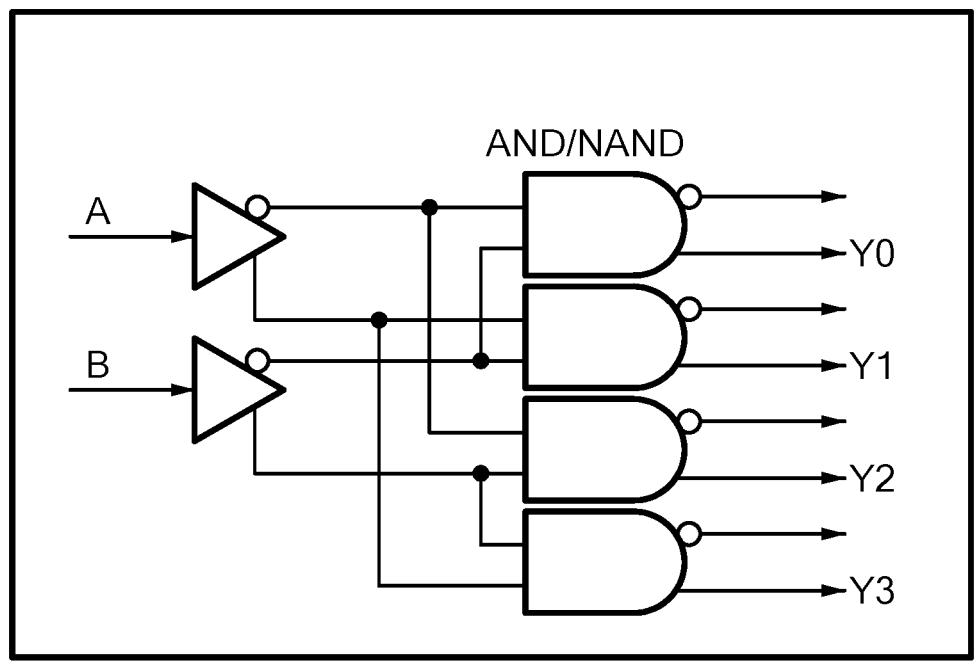
FIG. 3 is a schematic circuit diagram showing an example combinatorial circuit for an address decoder operable with SEDL.
Figure 6:
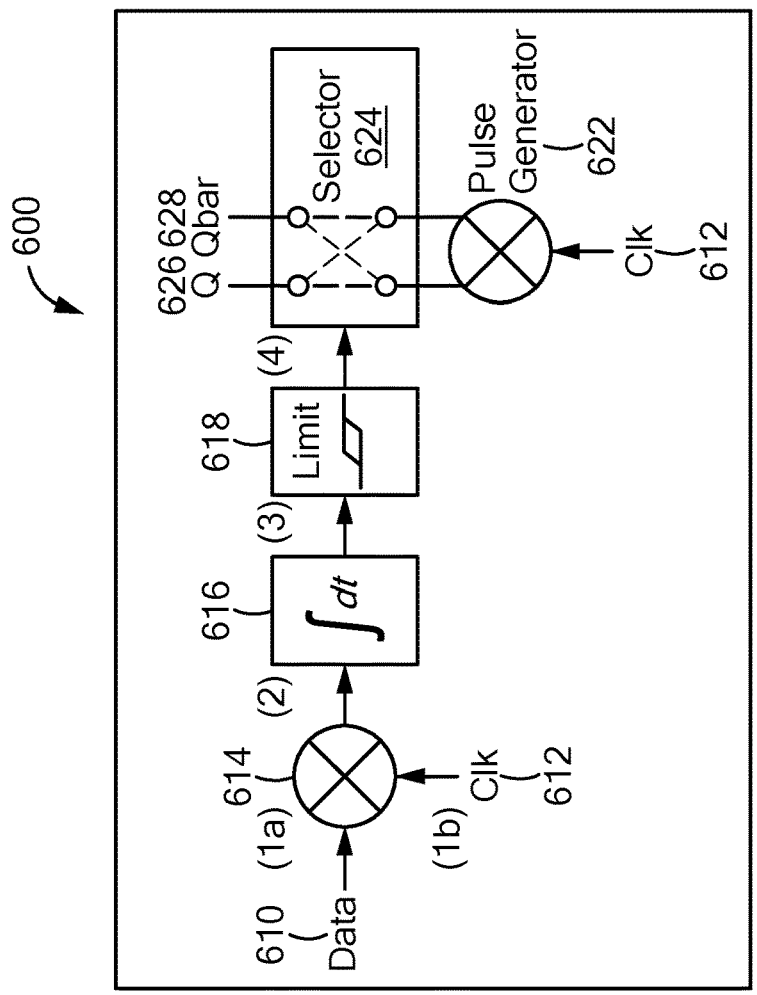
FIG. 6 is a block diagram showing an example sequential circuit to implement the SEDL techniques of the present disclosure.
Figure 5:
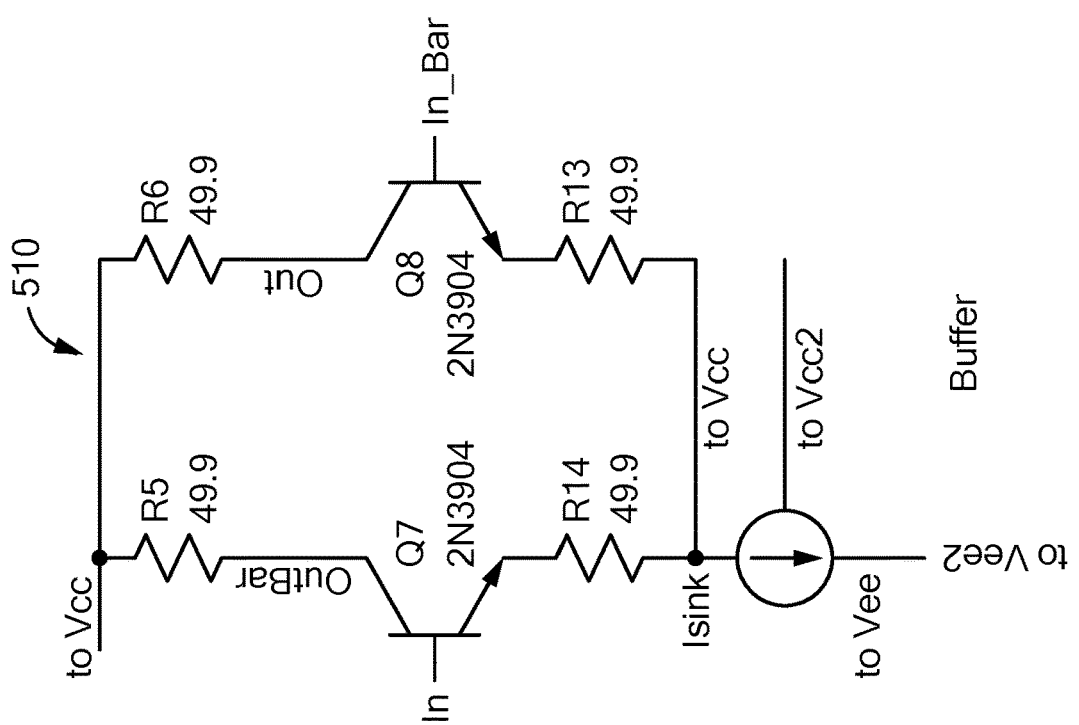
FIG. 5 is a schematic diagram showing an example combinatorial buffer circuit operable with SEDL.

The concepts of the present disclosure output spectrally efficient pulses at the output of the ADC 114 and receive spectrally efficient pulses at the DAC 120, which determines the logic state using pulses, as will be appreciated upon reading the present disclosure. Refer to FIGS. 3 and 5 showing example combinatorial circuits using SEDL concepts and refer to FIG. 6 showing an example sequential circuit using the SEDL concepts.

It should be appreciated that although only one sensor and one actuator are shown in FIG. 1, the concepts described herein are applicable to systems which include one or more sensors and one or more actuators, as well as to complex systems having multiple instances of system 100 as shown in FIG. 1 connected together to provide multiple sensors and multiple actuators under control of multiple processors or a single processor.

Example sensors for the sensor 110 include magnetic field sensors, motion sensors, microphones, acoustic sensors, optical receivers, RF sensors, electromagnetic sensors, or any other sensor that senses a parameter or other feature of an object or incoming signal (such as an optical or RF signal) and generates an analog or digital signal or otherwise uses digital logic. It will be appreciated that some sensors may be coupled to an ADC and may generate an analog signal that is digitized by the ADC, or may have an integrated ADC to produce a digital signal. The spectrally efficient techniques herein are applicable to both types of sensors to evaluate an incoming bit and output a Gaussian pulse as opposed to a conventional square waveform.

Figure 2:
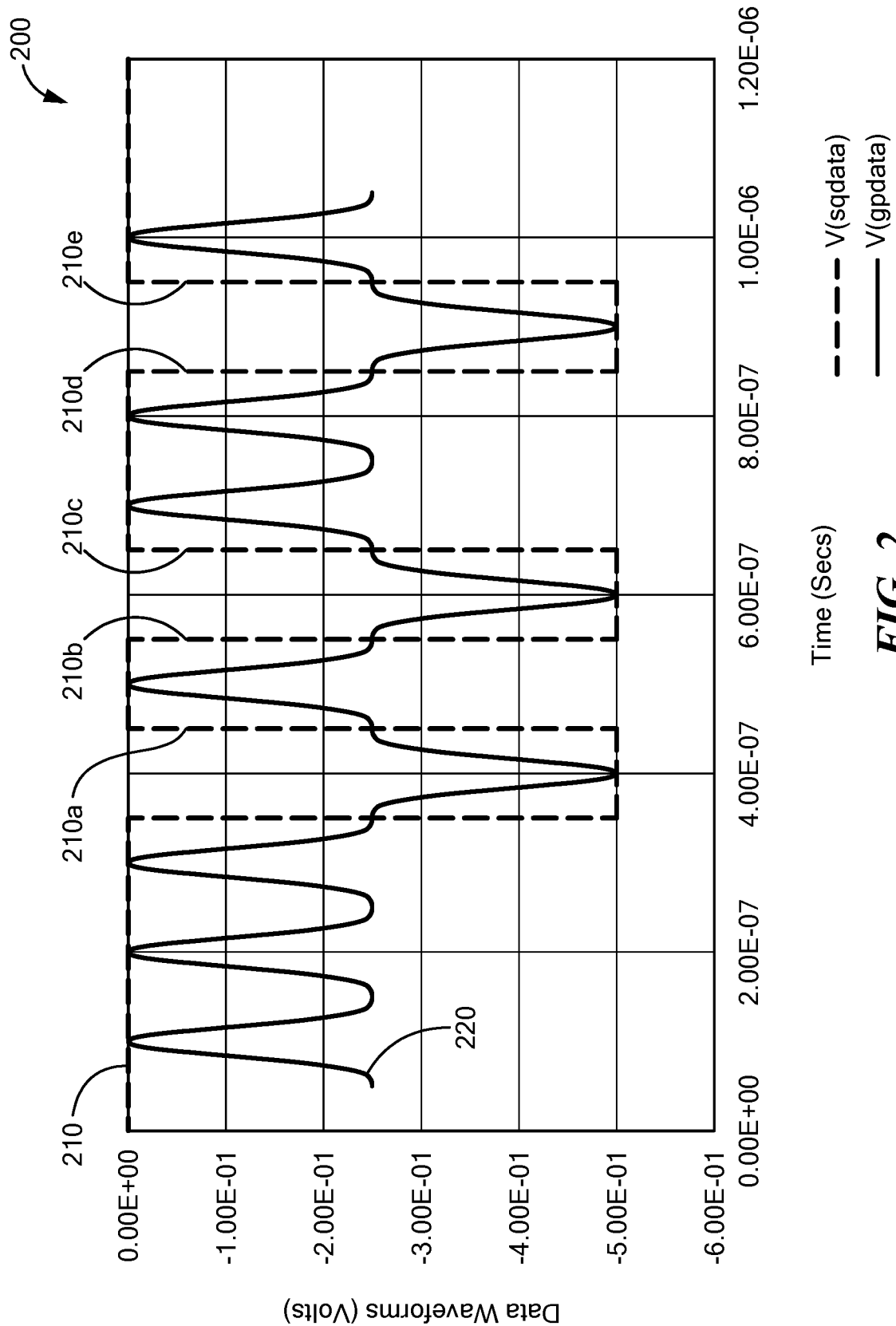
FIG. 2 is a graphical diagram in the time domain (i.e. a plot of voltage vs. time) showing an example of a conventional logic waveform and an example of a spectrally efficient example waveform.

Referring now to FIG. 2, a conventional waveform 210 has rising and falling edges having a substantially square shape. See, for example, rising edges 210a, 210c, 210e of the square waveform 210 and falling edges 210b, 210d of the square waveform 210. As noted above, such square edges can generate undesired spectral content. The square signals contain two levels representing binary states 0 and 1, with the transition between logic states (e.g. a "0" state and a "1" state) occurring in a short period of time (generally referred to as a "narrow transition" between logic states). When such narrow transitions are combined with a relatively high I/O count (due to a circuit receiving or transmitting a large number of signals) a relatively high level of emissions may result. This is undesirable.

Waveform 220, on the other hand, corresponds to a spectrally efficient digital logic (SEDL) waveform which includes the same information (bits of data) as waveform 210. In an embodiment, the pulses which exist in the SEDL waveform 220 are formed using one or more Gaussian shaped pulses.

As illustrated in FIG. 2, each bit of data in the square waveform 210 has a corresponding set of Gaussian pulses (with a set of pulses defined herein as one or more pulses) in the spectrally efficient waveform 220. Note that the transition between logic states in a spectrally efficient waveform takes a longer period of time as compared to such a transition in a conventional square waveform. Thus, the spectrally efficient waveform is said to have a slower transition timing than a conventional waveform having rectangular or square-shaped pulses. With each bit is represented by one Gaussian-shaped pulses producing a corresponding Gauss shaped frequency spectrum and is more spectrally efficient (i.e., has fewer harmonics and/or occupies a smaller portion of the frequency spectrum) than a conventional rectangular (square-shaped) pulse.

A Gaussian-shaped pulse can be expressed as $EXP-0.5*(t/\sigma)^2$ Fourier Transform $\rightarrow \sigma*sqrt(2*\pi)*EXP-0.5*(\omega*\sigma)^2$, where t is time, w is angular frequency, and a is 14.74% of a bit period. Another useful property of a Gaussian-shaped pulse is that it survives integration and/or differentiation as occurs in filtering operations. Gaussian pulse also eliminate the need for an associated clock to the square wave, as each bit is represented by a Gauss shaped pulse.

Note that by replacing the conventional square waveform with a spectrally efficient waveform having a plurality of pulses, the pulses not only provide the logic value (high or low), but also provide the number of instances of that logic value (e.g., the number of bits). So rather than providing a logical high or low, the spectrally efficient waveform provides separate pulses for each logic value that correspond to each bit of the waveform.

When receiving an incoming SEDL waveform, in order to derive the logical value associated with each of the SEDL pulses, a complementary SEDL signal is compared to the original SEDL signal. The Gauss pulse data is differential so that the data signal is actually the signal minus its complement. The original SEDL signal minus its complementary signal has a value comparable to the conventional square wave peak to peak value.

Although described in some instances as being a Gaussian Pulse shaped waveform, it should of course, be appreciated that any spectrally efficient waveform can be implemented in accordance with the present disclosure. Other examples of spectrally efficient waveforms include (1) approximations to Gaussian pulses, (2) sinusoidal waveforms, (3) a non-return-to-zero (NRZ) waveform (e.g., formed by summing the outputs of two cascaded SEDL flip-flops) which appears to be similar to traditional square waves, but it is spectrally efficient due to the slow edges on bit transitions.

Figure 4:
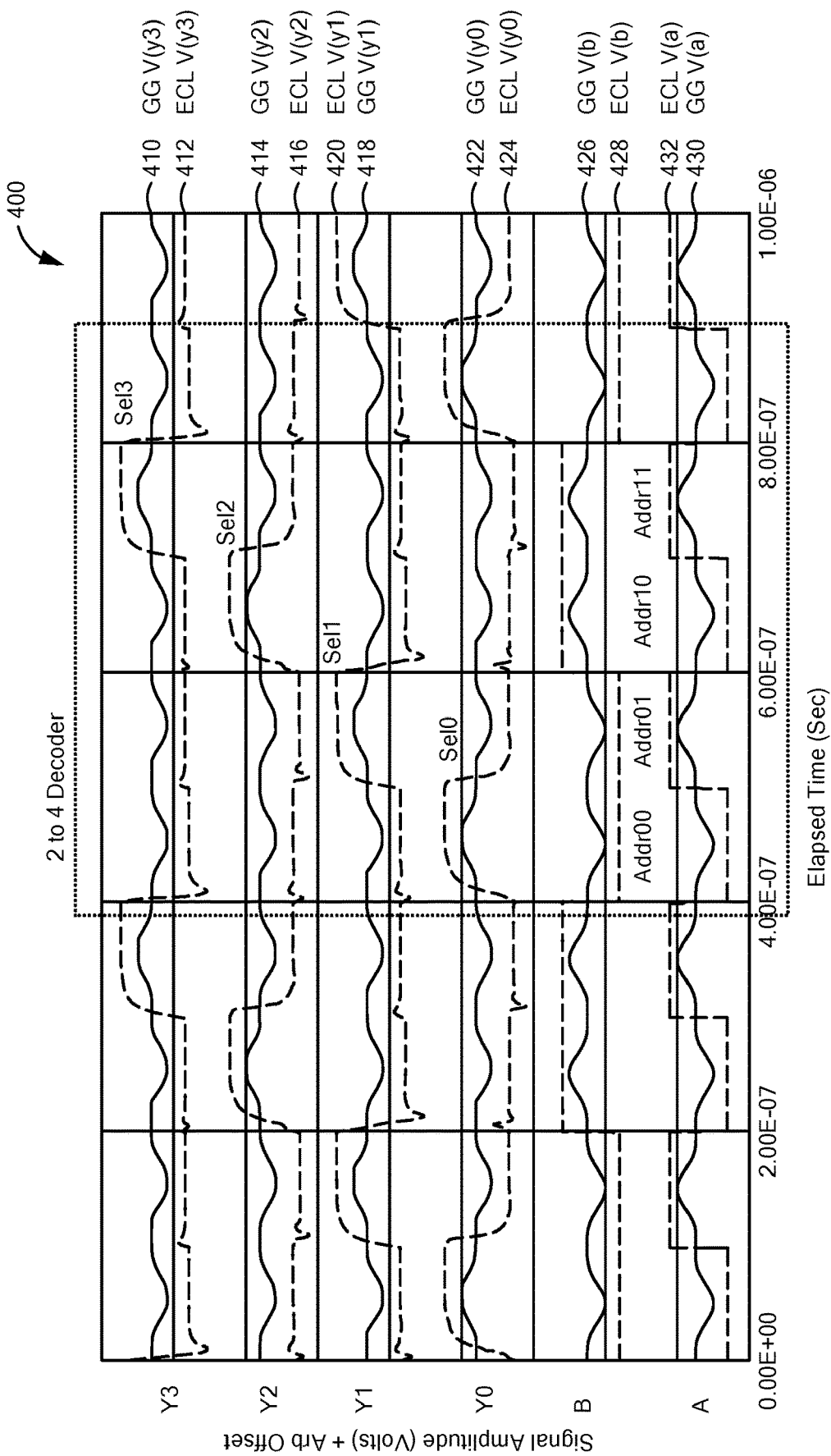
FIG. 4 is a graphical diagram in the time domain showing example conventional logic waveforms and example SEDL waveforms for the combinatorial circuit of FIG. 3.

Reference is now made to FIGS. 3-4 showing an example combinatorial circuit for an address decoder and the various signals associated therewith, in accordance with an embodiment of the present disclosure. FIG. 3 is a schematic circuit diagram showing an example combinatorial circuit 300 for an address decoder, and FIG. 4 is a graphical diagram 400 showing both conventional logic example waveforms and spectrally efficient example waveforms for the combinatorial circuit of FIG. 3.

Referring first to FIG. 3, an illustrative address decoder circuit 300 is an example combinatorial circuit capable of receiving a 2 bit address (A, B) and has four (4) corresponding device select lines (Y0, Y1, Y2, Y3). The address decoder circuit 300 is operable with SEDL pulses (i.e. spectrally-efficient waveforms) to implement the digital logic without any modifications required to the circuit design.

Thus, in response to one or more spectrally-efficient pulses corresponding to an address for a particular device provided to the decoder circuit address inputs A, B the decoder provides an output signal on a selected one of outputs Y0, Y1, Y2, Y3 for the particular device. It should be appreciated that although FIG. 3 illustrates a single address decoder capable of serving multiple devices coupled to an address bus (i.e. each device coupled to one of outputs Y0, Y1, Y2, Y3), the SEDL pulses described herein are also useful when used with a dedicated, single-output address decoder which may be incorporated into each device on an address bus.

Various input and output waveforms are shown in FIG. 4 as both square waveforms and Gaussian pulse-shaped waveforms to illustrate use of both types of waveforms in the combinatorial circuit. The waveforms show the same information, with each bit in the conventional square wave being represented by either a logical high or low value, and each bit in the SEDL waveform being represented by a pulse.

As shown in FIG. 3, the input of the OR gate 310 is coupled to input signal "B". Similarly, the first input of the OR gate 312 is coupled to the input signal "A". The output of the OR gate 310 is coupled to each of the AND (or NAND) gates 320, 322, 324, 326. The output of the OR gate 312 is coupled to the other input for each of the AND (or NAND) gates 320, 322, 324, 326. The output of the AND gates 320, 322, 324, 326 are the select lines Y0, Y1, Y2, Y3, respectively.

As shown in FIG. 4, input signals A and B (and identified with reference numerals 426, 430) are used to select lines Y0, Y1, Y2, or Y3 on the decoder. Significantly, inputs A and B are spectrally-efficient waveforms 430, 426.

For comparison, corresponding conventional square waveforms 432, 428 are also shown.

As shown, when A is 0 and B is 0 the output is Y0; when A is 1 and B is 0, the output is Y1; when A is 0 and B is 1 the output is Y2; and when A is 1 and B is 1 the output is Y3. This provides four select lines using two inputs and same result using square and Gaussian-shaped pulse waveforms. Note that the spectrally-efficient waveforms provide the same output without emissions concerns associated with conventional square waveforms. The Gaussian pulse can nominally have a fixed value within a given logic family. For example, the Gaussian pulse can have a 0.25 volts peak for this implementation of a CML/ECL type of cases. Other values can be used, however, for different implementations. For example, TTL can be 0V for a logic 0 ("low") and 5V or 3.3V for a logic 1 ("high"). Different voltage values can be used for different SEDL families.

FIG. 5 is a schematic diagram showing an example combinatorial buffer circuit 510, in accordance with an embodiment of the present disclosure. The combinatorial buffer circuit 510 includes a unity gain, current source fed, differential buffer. This provides the signal in true and complementary form. The logic element is an ECL-like "OR" structure (not shown). The potential at the emitter coupled junction of the logic element, is the logical "OR" of its inputs. When using conventional square-shaped waveforms, it is desired to have as much gain as possible to force the signal into a square waveform shape. However, it is not desired to have this same gain when using spectrally-efficient pulses. In fact, the opposite (a reduction in gain) is desired to ensure that the signal does not try to lock into square shape. Thus, resistors (R5, R6, R15, R16) are added to the logic element to reduce gain, so it does not try to force the signal into a square-shaped waveform and thus retains the spectrally-efficient waveform pulses.

Figure 7:
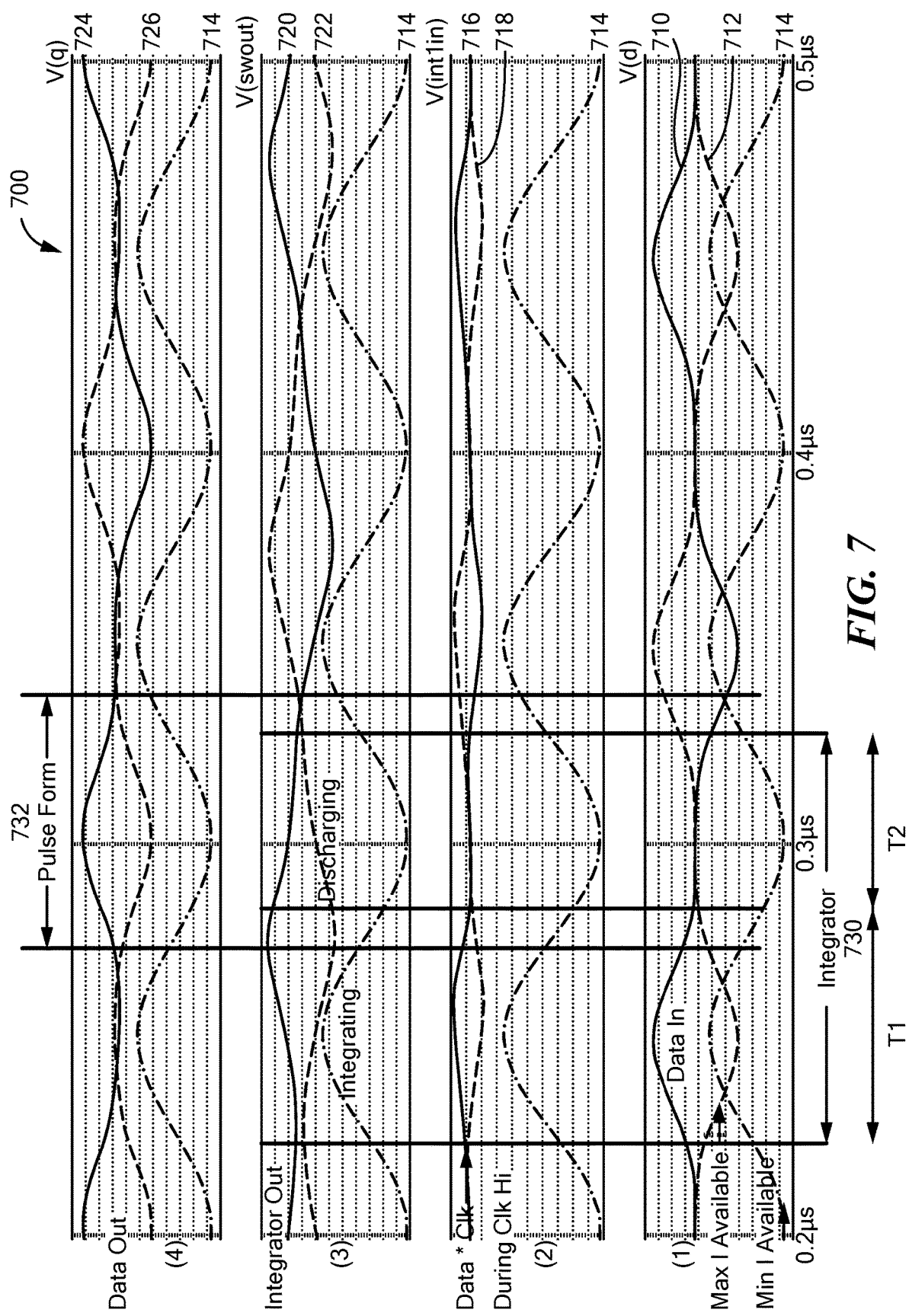
FIG. 7 is a graphical diagram showing various signals of the example sequential circuit of FIG. 6, illustrating an integrating portion and a discharging portion of the signal processing.
Figure 8:
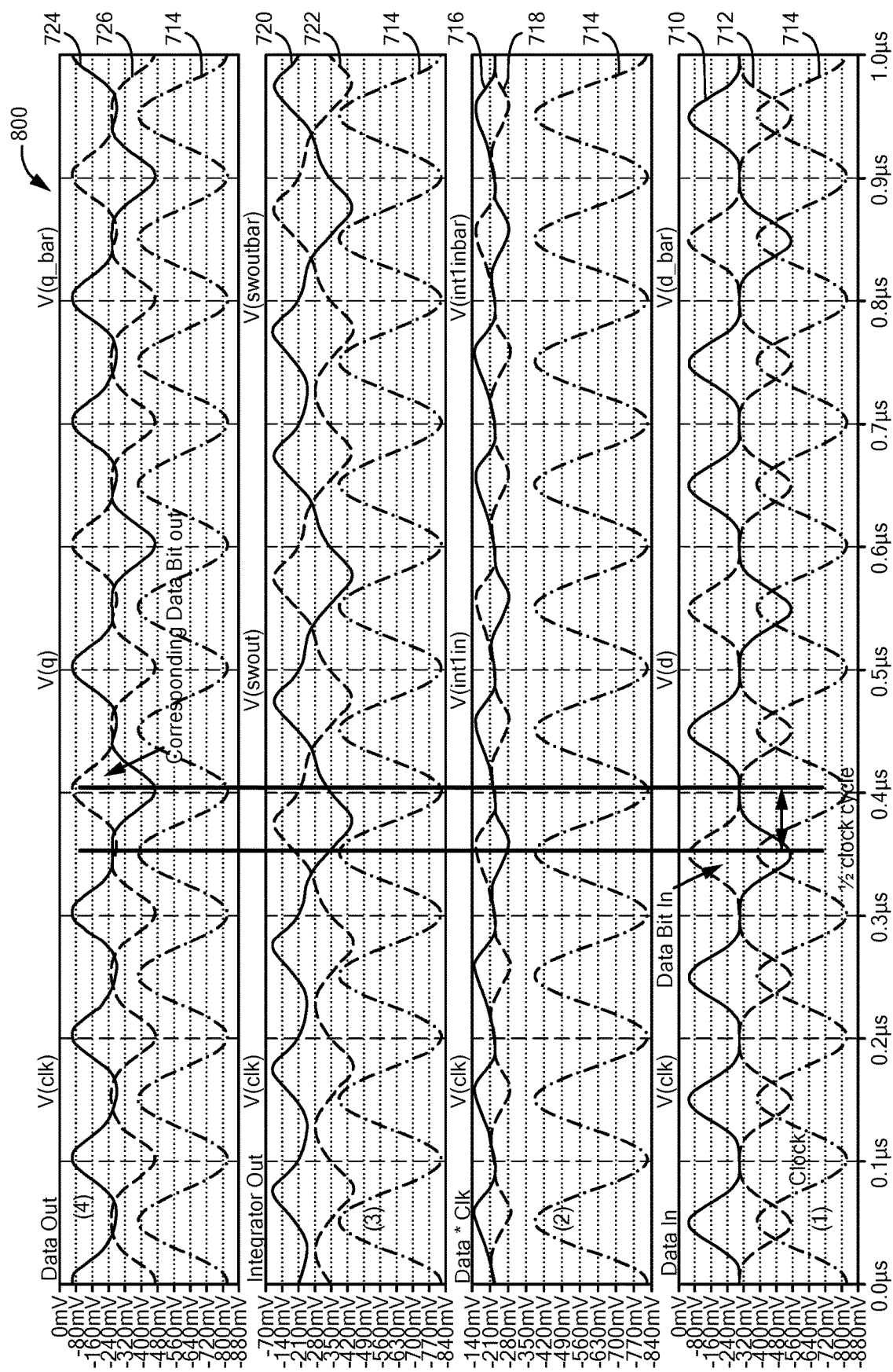
FIG. 8 is a graphical diagram showing various signals of the example sequential circuit of FIG. 6, showing the data in, data out, and clock cycle delay.

Reference is now made to FIGS. 6-8 showing an example sequential circuit 600 and graphical diagrams 700 and 800 of the various signals associated therewith, in accordance with an embodiment of the present disclosure. FIG. 6 is a block diagram showing an example sequential circuit 600 to implement the SEDL techniques of the present disclosure. FIG. 7 is a graphical diagram 700 showing various signals of the example sequential circuit of FIG. 6, showing an integrating portion and a discharging portion of the signal processing. FIG. 8 is a graphical diagram 800 showing various signals of the example sequential circuit of FIG. 6, showing the data in, data out, and clock cycle delay.

With reference to FIG. 6, the SEDL sequential device 600 assesses the state of an incoming bit on the data input 610 by integrating over a first portion of the clock period and then discharging over the second portion. The data input 610 and clock signal 612 are received at the multiplier circuit 614 of the SEDL sequential circuit 600. The multiplier circuit 614 is configured to provide a product signal corresponding to the product of the data input signal 610 multiplied the clock signal 612. An integrator circuit 616 has an input coupled to the output of the multiplier circuit 614 and an output coupled to a limit circuit 618. The integrator circuit 616 is configured to integrate the product signal over a first portion of a clock period to determine a logic state of the input signal 610. The limit circuit 618 has an input coupled to the output of the integrator circuit 616 and has a pulse generator output. The limit circuit 618 is configured to apply limits to a state result provided to the input of the limit circuit 618 from said integrator circuit 616. The SEDL sequential device 600 includes a pulse generator 622 having an input coupled to the output of the limit circuit 618 and has an output. The pulse generator 622 is configured to receive the logic state from the limit circuit 618 and to provide an output signal (i.e., discharge) over a second portion (e.g., a second-half) of the clock period at the output thereof having a spectrally-efficient shaped output signal pulse, wherein the spectrally-efficient shaped output signal pulse represents a logic value corresponding to the logic value of the input signal 610.

The integrator circuit is configured to determine the logic state of the input signal during a first period (e.g., a first-half) of a clock period according to:

$$\text{State}(k) = \int_{t_k}^{t_k+T/2} \text{Input}(t_k) * \text{Clk}(t_k) dt$$

in which:
State(k) is the logic state of the input signal;
Input(t) is the input signal at time; and
Clk(t) is the clock signal at time.

Integrating by the integrator circuit 616 over a first portion (e.g., first-half) of a clock period provides the "average" value of the bit, which is provided to the filter 618. The average is then slowly discharged over the second portion (e.g., second-half) of the clock period. The aggregate "integrate-discharge" operation reflects the logic state of the input signal.

Providing the determined logic state to the pulse generator 622 comprises applying limits to the state result, formulating the pulses from the incoming clock, and the output state of the integrator determines the polarity of the pulse generator output circuit.

FIG. 7 shows the various signals corresponding to the example sequential circuit of FIG. 6 and illustrates the integrating portion during a first time period T1 and the discharge portion during the second time period T2, which are used to determine the logic state of the input signal. The first time period T1 can be a first-half of the clock cycle, and the second time period T2 can be a second-half of the clock cycle. The first time period T1 and the second time period T2 do not overlap with each other and can be the same duration or one period can be longer or shorter than the other. As will be appreciated in light of the present disclosure, the state is then fed to a pulse generator arrangement 622 which generates a new pulse with every clock cycle. Limits to the state are applied to the logic state by the limit circuit 618.

The various waveforms shown in FIGS. 7 and 8 include (i) the data-in waveform 710 which can be the value input at data 610 to the multiplier circuit 614 in FIG. 6, (ii) data-in bar waveform 712, (iii) the clock signal waveform 714, (iv) the data*clock waveform 716 which can be the output of the multiplier circuit 614 of FIG. 6, (v) the data*clock bar waveform 718, (vi) the integrator output waveform 720 which can be the output of the integrator circuit 616 of FIG. 6, (vii) the integrator output bar waveform 722, (viii) the data out waveform 724 which can be Q output 626 in FIG. 6, and (ix) the data out bar waveform 726 which can be Qbar output 628 in FIG. 6.

As shown in FIG. 8, the output is delivered one-half of a clock cycle later than the input. The state is held for one clock cycle. Note that the output data 832 matches the input data 830 with a half clock cycle delay, as is similarly observed with the conventional flip-flop logic gate.

Figure 9:
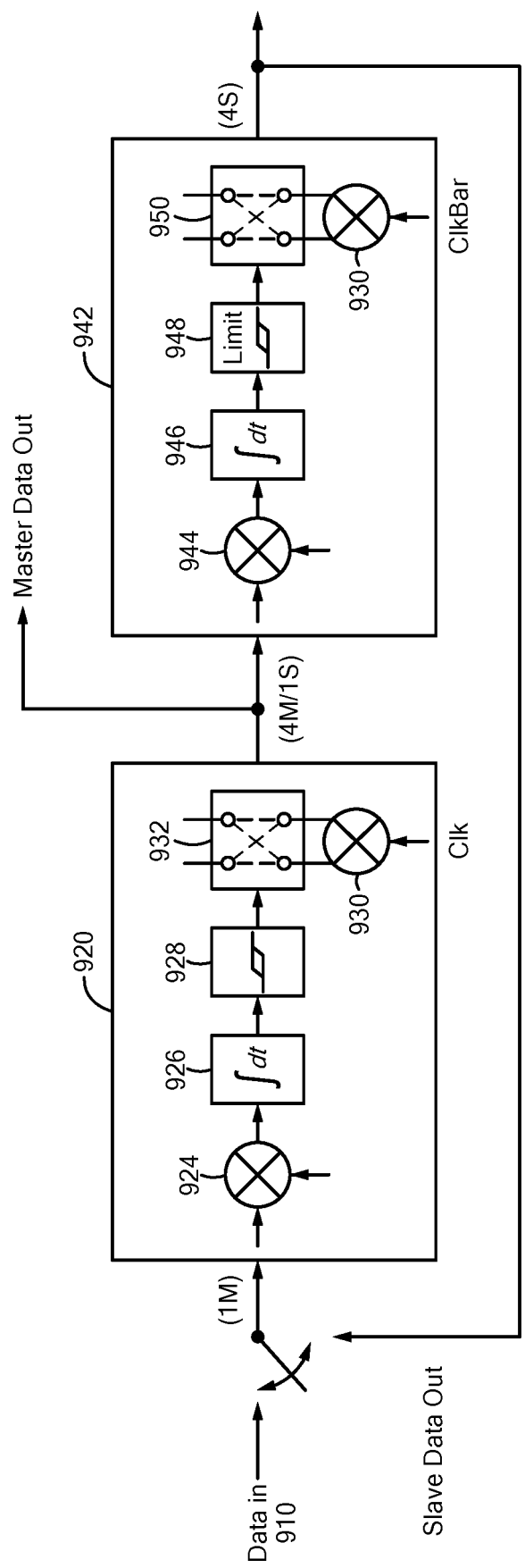
FIG. 9 is a block diagram showing an example sequential state retention circuit having a master flip-flop and a slave flip-flop.
Figure 10:
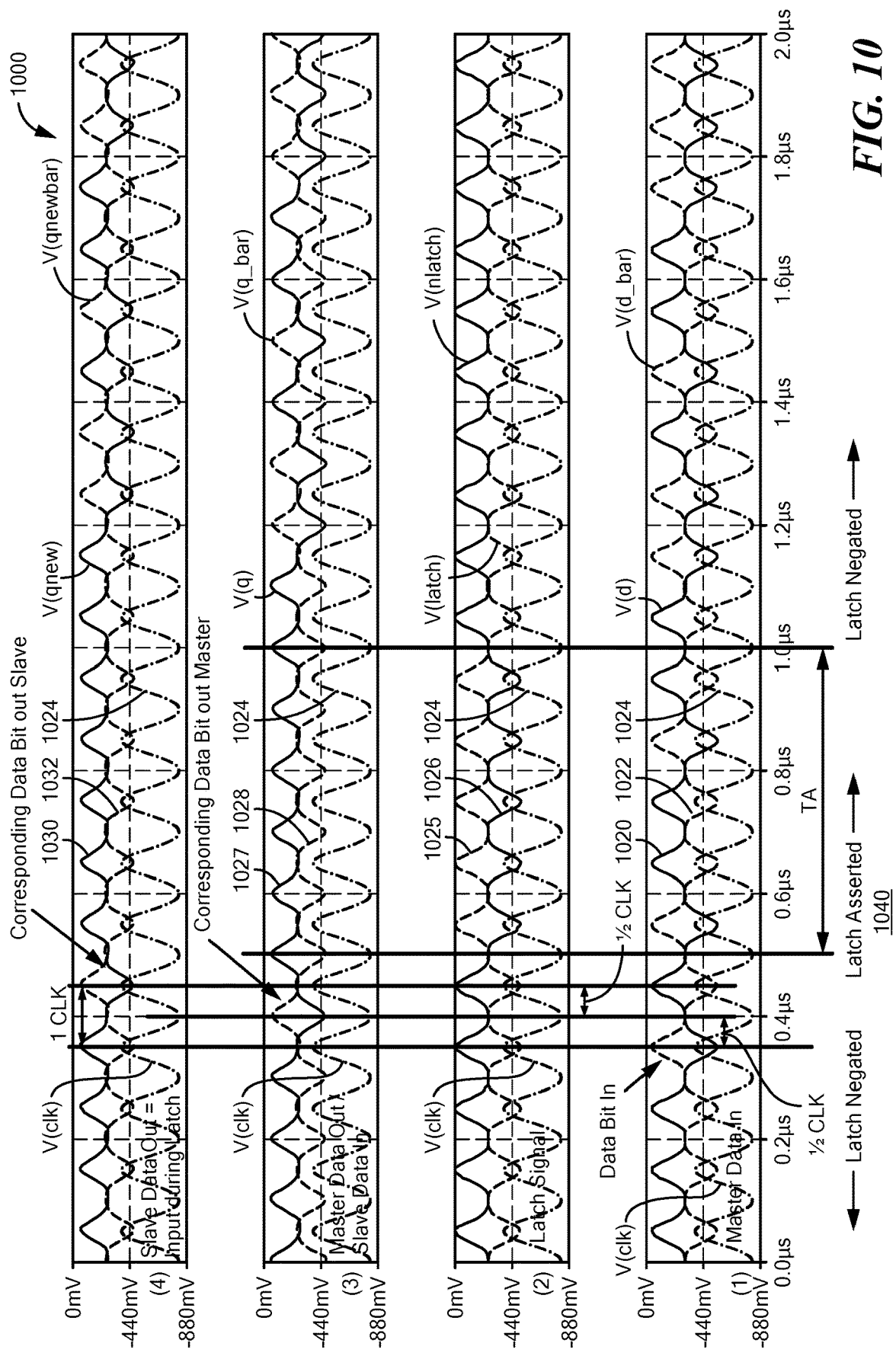
FIG. 10 is a graphical diagram showing the waveforms of the example sequential state retention circuit of FIG. 9.

Reference is now made to FIGS. 9-10 showing an example sequential state retention circuit 900 and a graphical diagram 1000 of the corresponding various input and output waveforms, according to an embodiment of the present disclosure. FIG. 9 is a block diagram 900 showing an example sequential state retention circuit having a master flip-flop and a slave flip-flop. FIG. 10 is a graphical diagram 1000 showing the waveforms of the D flip-flop circuit.

As shown in FIG. 9, a state retention device 900 is provided by using two D flip-flops in a master-slave arrangement and implementing the spectrally-efficient techniques of the present disclosure. As will be appreciated upon reading the present disclosure, to implement the spectrally-efficient pulses, each flip-flop 920, 942 includes, respectively, a multiplier circuit 924, 944; an integrator circuit 926, 946; a limit circuit 928, 948; and a pulse generator/selector arrangement 930/932, 910/942. A conventional D-type flip-flop typically holds a state for one clock cycle and is capable of holding the state indefinitely. SEDL flip-flops can also hold the state indefinitely.

The input of the first (master) flip-flop 920 can be switched from new data 910 to the output of the second (slave) flip-flop 942 for previously read data. The state can now be held indefinitely by including the second flip-flop. When the master 920 is listening to the slave 942, it holds the save until the master 920 is switched back to listening to data input 910. Operating a device whose input is listening to its output can often create stability issues. The integration and regeneration topology used with the spectrally-efficient techniques of the present disclosure facilitates indefinite state retention, without producing a stability problem. The integrate/regenerate topology:

$$\text{State}(k) = \int_{t_k}^{t_k+T/2} \text{Input}(t_k) * \text{Clk}(t_k) dt$$

$$GP\text{dataOut} = \text{Limit}[\text{State}(k)] * \{\cos(2*pi*f*t)+1\}^2$$

The matched filter output is "limited" (by the limit circuit 928) before driving the pulse generator which, in effect, holds the poles of the system on the jw axis at the clock frequency. The poles do not lie in either the right or left half plane which would cause an exponential increase or decay of the data being held indefinitely.

As shown in FIG. 10, the logic state can be saved for on clock cycle within a flip flop. The output is one-half clock cycle delayed from the input. A second flip-flop (slave) 942 can be attached to the output of the master 920. This saves the data for another clock cycle. The data out of the master 920 is delayed by one-half of a clock cycle with respect to its input 910. The data out of the slave 942 is delayed by one-half of a clock cycle with respect to its input, which is 1 full clock cycle delayed with respect to the Master input. The slave output is in phase with the master data in 910, but with a full clock cycle of delay. The output of the slave is 1 clock cycle delayed from the input of Master flip-flop 920.

The various waveforms shown in FIG. 10 include (i) the data-in waveform 1020 which can be the value input at data 910 to the multiplier circuit 914 of FIG. 9, (ii) the data-in bar waveform 1022, (iii) the clock signal waveform 1024 which can be the clock (clk) of FIG. 9, (iv) the latch waveform 1025 which can be latch command controlling the data in 910 of FIG. 9, (v) the latch bar waveform 1026, (vi) the master data out/salve data in waveform 1027 which can be the output of the pulse generator 930 and selector 932 as well as the input to the multiplier circuit 944 of the second flip-flop 942, (vii) the master data out/slave data in bar waveform 1038, (viii) the slave data out waveform 1030 which can be the Q output of pulse generator 940 and selector 950 of the slave flip-flop 942, and (ix) the slave data out bar waveform 1030, which can be the Q bar output of the pulse generator 940 and selector 950 of the slave flip-flop 942 of FIG. 9. When the latch command is asserted 1040, the master input waveform 1020 is fed by the salve output waveform 1030, and whatever logic state is present at the output is held for as long as the latch remains asserted (period "TA").

Figure 11:
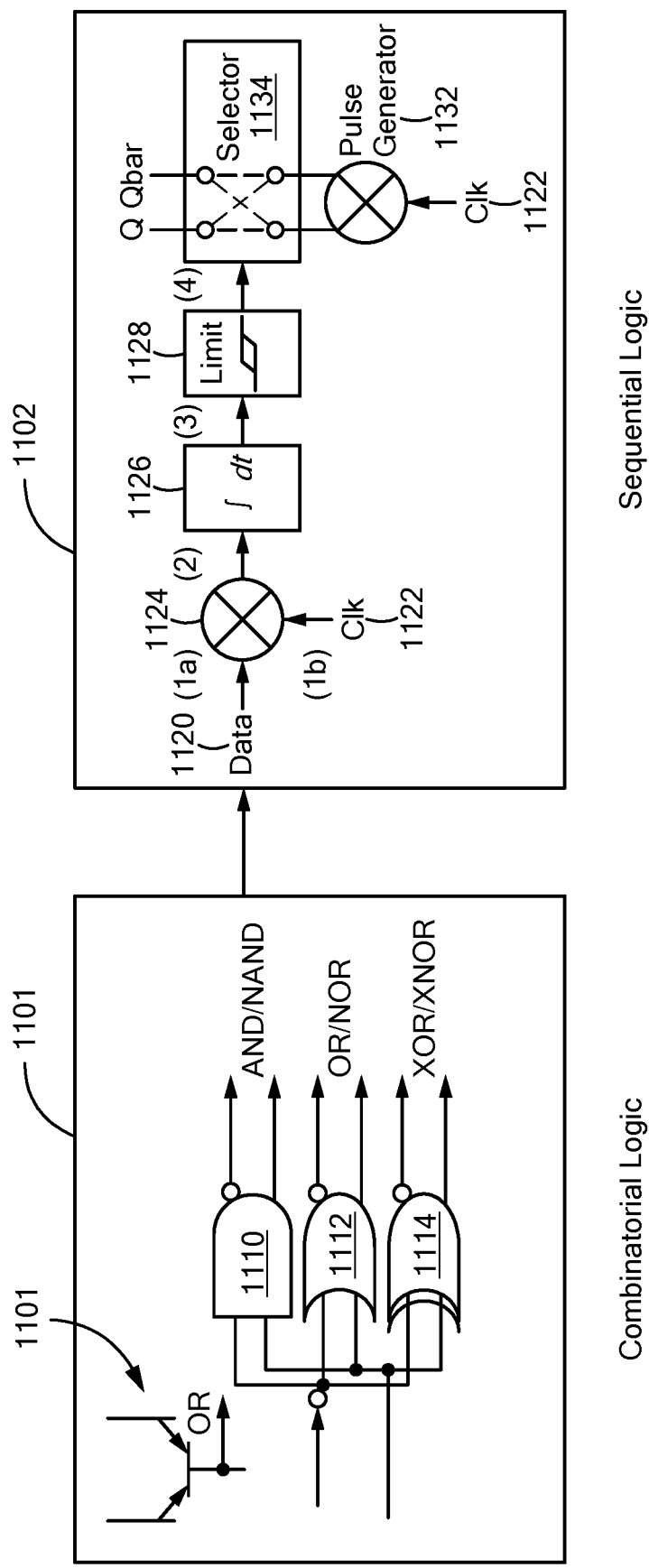
FIG. 11 is a block diagram showing a combined circuit including both combinatorial logic elements and sequential logic elements, using the SEDL techniques in accordance with the present disclosure.

FIG. 11 is a block diagram showing a circuit including combinatorial logic and sequential logic, and operable using the SEDL techniques in accordance with the present disclosure. It will be appreciated in light of the present disclosure that the SEDL techniques can be implemented in combinatorial logic circuits and in sequential logic circuits, as well as in circuits having both combinatorial logic and sequential logic, as shown in FIG. 11. As shown, the combinatorial logic circuit 1101 includes a AND/NAND gate 1110, OR/NOR gate 1112, and XOR/XNOR gate 1114. Using the spectrally-efficient waveforms of the present disclosure, the output of any of the appropriate gates 1110, 1112, or 1114 can be input as data to the sequential circuit 1102. The sequential circuit 1102 is similar to those described herein, including a multiplier circuit that multiplies the data-in 1120 by the clock 1122, an integrator circuit 1126, a limit circuit 1128, a pulse generator 1132 and a selector 1134 to select between Q 1136 and Qbar 1138.

As is known, combinatorial circuits implement Boolean functions and are functions of their inputs only and are not based on clocks or states, whereas sequential circuits compute their output based on the output and the state, with the state being updated based on a clock input. Thus, the sequential circuits have state and memory, whereas the combinatorial circuits do not have state or memory.

It will be appreciated upon reading the present disclosure that the spectrally efficient techniques assume that the shortest data pulse is one clock cycle wide. Meaning, the fastest data transition is not longer than one clock cycle.

Having described preferred embodiments which serve to illustrate various concepts, structures and techniques which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

All publications and references cited herein are expressly incorporated herein by reference in their entirety.

What is claimed is:

1. In a circuit, a method to assess a state of an incoming bit, the method comprising:
    receiving an input signal;
    receiving a clock signal;
    obtaining, using a multiplier circuit, a product signal from the product of the input and clock signals;
    integrating the product signal over a first portion of a clock period of the clock signal to determine a logic state of the input signal, the first portion of the clock period being less than the clock period of the clock signal;
    providing the determined logic state to a pulse generator; and
    providing an output signal having a spectrally-efficient-shape at an output of the pulse generator, wherein the spectrally-efficient-shaped output signal represents a logic value corresponding to the logic value of the input signal, wherein the spectrally-efficient shaped output signal comprises Gaussian-shaped pulses.

2. The method of claim 1, wherein the first portion of the clock period of the clock signal over which the product signal is integrated is a first-half of the clock period of the clock signal and the output signal is output by the pulse generator over a second-half of the clock period of the clock signal.

3. The method of claim 1, wherein the product signal is integrated over the first portion of the clock period of the clock signal and the output signal is output by the pulse generator over a second non-overlapping portion of the clock period of the clock signal.

4. The method of claim 1 wherein integrating the product signal over the first portion of a clock period of the clock signal comprises:
    obtaining an average value;
    discharging the average over the second half of the clock period of the clock signal; and
    determining the logic state (State(k)) of the input signal according to:

$$\text{State}(k) = \int_{t_k}^{t_k+T/2} \text{Input}(t_k) * \text{Clk}(t_k) dt$$

in which:
    State(k) is the logic state of the input signal;
    Input(t) is the input signal at time t;
    Clk(t) is the clock signal at time t.

5. The method of claim 1 wherein providing the determined logic state to a pulse generator comprises:
    applying limits to state result;
    formulating the pulses from the incoming clock; and
    State steers a 0 to Q and a 1 to Qbar or vise-versa.

6. The method of claim 1, wherein the spectrally efficient waveform is formed by EXP $-0.5*(t/\sigma)^2$ Fourier Transform $\rightarrow \sigma*\text{sqrt}(2*\pi)*\text{EXP} -0.5*(\omega*\sigma)^2$.

7. The method of claim 1, wherein the circuit comprises a combinatorial circuit.

8. The method of claim 1, wherein the circuit comprises a sequential circuit.

9. A circuit comprising:
    a multiplier circuit having a first input configured to receive an input signal and having a second input configured to receive a clock signal and having an output configured to provide a product signal corresponding to the product of the input signal and the clock signal;
    an integrator circuit having an input coupled to the output of said multiplier circuit and having an output, said integrator configured to integrate the product signal over a first portion of a clock period of the clock signal to determine a logic state of the input signal, the first portion being less than the clock period of the clock signal;
    a limit circuit having an input coupled to the output of said integrator circuit and having an output, said limit circuit configured to apply limits to a state result provided to the input thereof from said integrator circuit; and
    a pulse generator having an input coupled to the output of said limit circuit and having an output, said pulse generator configured to receive the logic state from said limit circuit and to provide over the clock period at the output thereof an output signal having a Gaussian-shape output signal pulse, wherein the Gaussian-shaped output signal pulse represents a logic value corresponding to the logic value of the input signal.

10. The circuit of claim 9, wherein the product signal is integrated over a first-half of the clock period of the clock signal and the output signal is output by the pulse generator over a second-half of the clock period of the clock signal.

11. The circuit of claim 9, wherein the product signal is integrated over a first portion of the clock period of the clock signal and the output signal is output by the pulse generator over a second non-overlapping portion of the clock period of the clock signal.

12. The circuit of claim 9 wherein:
    said integrator is configured to determine during the first portion of the clock period of the clock signal, a logic state of the input signal according to:

$$\text{State}(k) = \int_{t_k}^{t_k+T/2} \text{Input}(t_k) * \text{Clk}(t_k) dt$$

in which:
  State(k) is the logic state of the input signal;
  Input(t) is the input signal at time t; and
  Clk(t) is the clock signal at time t.

13. The circuit of claim 9, wherein the spectrally efficient waveform is formed by EXP −0.5*(t/σ)^2 Fourier Transform→σ*sqrt(2*π)*EXP −0.5*(ω*σ)^2.

14. A method to generate a signal having a spectrally efficient shape, the method comprising:
  receiving an input signal corresponding to at least one digital bit having a square wave shape;
  receiving a clock signal;
  multiplying, using a multiplier circuit, the input signal and the clock signal to provide a product signal;
  integrating the product signal over a first portion of a clock period of the clock signal to produce a value the first portion being less than the clock period of the clock signal;
  determining a logic state of the input signal using the value; and
  generating an output signal having a logic value corresponding to the logic value of the input signal and having a spectrally-efficient-shape and comprising Gaussian-shaped pulses.

15. The method of claim 14 wherein integrating the product signal over a first portion of a clock period of the clock signal to produce a value comprises integrating the product signal over a first-half of a clock period of the clock signal to provide an average value of the at least one digital bit.

16. The method of claim 15 wherein determining a logic state of the input signal using the value comprises discharging the average value of the at least one digital bit over a second-half of the clock period of the clock signal non-overlapping with the first-half of the clock period, such that the aggregate integrate-discharge operation produces a state result which reflects the logic state of the input signal.

17. The method of claim 15 wherein generating an output signal having a logic value corresponding to the logic value of the input signal and having a spectrally-efficient-shape comprises applying limits to the state result, formulating pulses from the clock signal, and using the output of the integrator to determine a polarity of the output signal.

18. The method of claim 17 wherein the integrator is configured to determine during the first-half of a clock period of the clock signal a logic state of the input signal according to:

$$\text{State}(k) = \int_{t_k}^{t_k + T/2} \text{Input}(t_k) * \text{Clk}(t_k) dt$$

in which:
  State(k) is the logic state of the input signal;
  Input(t) is the input signal at time t; and
  Clk(t) is the clock signal at time t.

* * * * *